United States Patent [19]
Hamilton et al.

[11] Patent Number: 5,940,266
[45] Date of Patent: *Aug. 17, 1999

[54] BI-DIRECTIONAL COOLING ARRANGEMENT FOR USE WITH AN ELECTRONIC COMPONENT ENCLOSURE

[75] Inventors: Roger Duane Hamilton, Eyota; Sukhvinder Singh Kang; Christopher William Mann, both of Rochester, all of Minn.

[73] Assignee: International Business Machines Corporation, Armonk, N.Y.

[ * ] Notice: This patent issued on a continued prosecution application filed under 37 CFR 1.53(d), and is subject to the twenty year patent term provisions of 35 U.S.C. 154(a)(2).

[21] Appl. No.: 08/949,452

[22] Filed: Oct. 14, 1997

[51] Int. Cl.$^6$ .................................................... H05K 7/20
[52] U.S. Cl. .................. 361/695; 361/690; 361/694; 361/697; 361/719; 361/720; 361/721; 174/16.1; 165/80.3
[58] Field of Search ................................ 361/690, 691, 361/692, 694, 695, 697, 702, 703, 704, 707, 715, 716, 717, 718, 720, 721; 257/706, 721, 722; 174/15.1, 16.1, 16.3; 165/80.2, 80.3, 104.33

[56] References Cited

U.S. PATENT DOCUMENTS

| | | | |
|---|---|---|---|
| 5,063,476 | 11/1991 | Hamadah et al. | 361/697 |
| 5,456,632 | 10/1995 | Ohtsu et al. | 361/695 |
| 5,563,768 | 10/1996 | Perdue | 361/695 |
| 5,566,377 | 10/1996 | Lee | 361/695 |
| 5,751,550 | 5/1998 | Korinsky | 361/695 |

*Primary Examiner*—Leo P. Picard
*Assistant Examiner*—Boris L. Chervinsky
*Attorney, Agent, or Firm*—Robert H. Berdo, Jr.; Matthew J. Bussan

[57] ABSTRACT

A processor book includes a processor card having front and rear surfaces, and at least one high heat component attached to the front surface. Two separate flows of cooling gas are conveyed to the processor card from two separate directions. A cooling duct is provided adjacent to the front surface of the processor card, and conveys one of the flows of cooling gas. The cooling duct has an outlet in a region of the high heat component.

11 Claims, 5 Drawing Sheets

BI-DIRECTIONAL COOLING ARRANGEMENT FOR USE WITH AN ELECTRONIC COMPONENT ENCLOSURE

BACKGROUND OF THE INVENTION

1. Field of the Invention

The invention relates to a bi-directional cooling arrangement for use with an electronic component enclosure, such as a processor book, for example, and in particular, to a cooling system used within a processor book, which delivers a cooling gas to a processor card from two different directions.

2. Background Information

Electronic components are frequently packaged in enclosures, for example to protect against contamination, electrical interference, and damage. For example, computer processor cards are conventionally packaged in an arrangement known as a processor book, in which one or more processor cards are sandwiched between two opposing covers. Referring to FIG. 1, a conventional processor book 10 is shown. The processor book 10 has covers which are connected together at their upper and lower edges using upper and lower rails 12 and 14, respectively. In this Figure, only the rear cover 16 is shown, with the front cover being removed for illustration purposes. The resulting package of rails and covers typically forms a hollow parallelepiped (i.e., a "book" shape), with the processor card 18 being located therein, and separated from the respective front and rear covers by a space. The parallelepiped is open along one edge, so that the processor card 18 can be connected to a backplane 20.

The processor book 10 is arranged within a computer housing (not shown) so as to be perpendicular to the backplane 20. Further, the processor book 10 is positioned between an upper and a lower cage shelf located within the computer housing. For illustration purposes, only the lower cage shelf 24 is shown. The lower cage shelf 24 includes guides 26 which engage with lower rail 14, and ensure that the processor book 10 is properly located. Likewise, the upper cage shelf (not shown) is provided with similar guides for engaging with the upper rail 12.

During operation, the processor card 18, and in particular, the processor modules (not shown) attached to the processor card, tend to consume a substantial amount of electrical power, and therefore generate a substantial amount of heat. Because excess temperature can impair a computer system's reliability and functionality, the processor cards 18 are provided with heat sinks 28 in a region of the respective processor modules, to help dissipate the generated heat. In the Figure, the heat sinks 28 hide the processor modules from view.

Moreover, the computer system is typically provided with one or more fans 30 which cause a cooling flow of air to pass over the heat sinks 28, thus causing a transfer of heat away from the heat sinks 28. Typically, fan 30 is attached beneath lower cage shelf 24 and within a blower housing 25, so as to be located beneath lower rail 14 of the processor book 10. The cooling air is thus drawn through air vents 32 provided in the upper rail 12, over the surfaces of the processor card 18, and out through air vents 34 provided in the lower rail 14. As will be appreciated, this flow of air is essentially parallel to a surface of the backplane 20 which the processor card 18 is attached to, as indicated by arrows 36.

Conventionally, the above cooling arrangement is used with processor cards 18 in which the cards are provided with the processor modules and heat sinks 28 generally non-symmetrically located thereon, i.e., in a somewhat random pattern. However, high performance SMP (Symmetrical Multi Processor) cards have been introduced, which require an improved cooling arrangement. With SMP cards, a plurality of processor modules are located adjacent to one another and spatially arranged in series along a connector edge of the processor card, so as to be placed as close to the backplane as possible. This reduces the distance from the processor modules to the backplane to a minimum, so that the desired signal timing for running at high clock speeds can be achieved. However, since the processor modules are spatially located in series, and in a direction of the flow of the cooling air in the conventional cooling arrangement, as the cooling air flows from one processor module and associated heat sink to the next, the air increases in temperature. This substantially reduces the ability to transfer heat away from the final processor modules, i.e., those processor modules lying closest to the lower rail. As such, these final processor modules, and even others adjacent thereto, may be caused to run at high temperatures that can impair the computer system's reliability and functionality.

In order to remove the heat generated by the processor modules and keep temperatures low, it is known to attach relatively massive heat sinks to the processor modules. However, this has a disadvantageous effect, since it is desirable to reduce the size of the heat sinks as much as possible, so that a compact electrical package can be obtained. By providing for a compact electrical package, faster signal timing is possible due to shorter electrical distances for signals to travel.

It is also known to provide additional fans to increase the air flow over the processor board, or to use so-called point cooling blowers in which an additional blower is used to blow cooling air directly on a specific location of the processor board. It is also known to attach a fan directly to a heat sink to form a so-called fan sink. However, such additional fans have the disadvantage of increasing the number of moving parts, all of which are susceptible to mechanical failure. Thus, the reliability of the computer system may be disadvantageously reduced with such arrangements. Further, the added fans take up additional space, disadvantageously reducing the compactness of the system.

Therefore, a need existed for a way of cooling such processor cards which is reliable and efficient, and which does not disadvantageously increase the size of the system.

SUMMARY OF THE INVENTION

It is, therefore, a principle object of this invention to provide an enhanced cooling arrangement for use with an electronic component enclosure.

It is another object of the invention to provide an enhanced cooling arrangement for a processor book that solves the above mentioned problems.

These and other objects of the present invention are accomplished by the bi-directional cooling arrangement disclosed herein.

According to one aspect of the invention, the electronic component enclosure to be cooled is a processor book having at least one processor card, such as a Symmetrical Multi Processor card. The processor card has front and rear surfaces. At least one high heat component is attached to the front surface of the card. The high heat component may be, for example, a heat sink covering a processor module. A cooling duct, comprised, for example, of plastic, is provided adjacent to the front surface of the processor card, and has an outlet in a region of the high heat component. The cooling duct is thus situated to deliver fresh cooling gas directly to the high heat component.

According to a further aspect of the invention, the processor book includes front and rear opposing covers having the processor card and the cooling duct therebetween. The rear cover is adjacent to and separated from the rear surface of the processor card by a space, and the front cover is adjacent to and separated from the cooling duct by a space. This allows for a first flow of cooling gas to be provided to the front and rear surfaces of the processor card in a first direction. The cooling duct provides a second flow of cooling gas directly to the high heat component in a second direction essentially perpendicular to the first direction. The processor book further includes upper and lower opposing rails connected to the front and rear covers. The rails are arranged to extend generally in the second direction, and have openings therethrough to allow the first flow of cooling gas to pass through the upper rail, over the processor card, and out through the lower rail. Moreover, the second flow of cooling gas passes from the outlet of the cooling duct, over the high heat component, and out through the lower rail. As a result of this arrangement, cooling gas is provided to the processor card from two different directions, so that heat generated by the processor card is effectively transferred to the cooling gas, and transported away. This is especially advantageous when processor modules are sequentially arranged along a common edge of the processor card, where the processor card is connected to a backplane.

Additionally, according to another aspect of the invention, a perforated cover may be provided which extends from the upper rail to the lower rail, and is arranged to cover an inlet of the cooling duct.

In a further aspect of the invention, the cooling duct is tapered toward the high heat component. This forms a nozzle which increases the speed of cooling gas over and around the high heat component.

In yet a further aspect of the invention, a baffle screen is provided in the outlet of the cooling duct. The baffle screen equalizes and regulates the cooling gas flow over the processor modules when a plurality of processor modules are present, and ensures that the upper-most modules (i.e., those closest to the upper rail) are provided with sufficient cooling gas. Without the baffle, the gas in the duct would tend to flow more rapidly past the lower-most modules, since the surrounding pressure is most reduced in this area.

Moreover, the baffle screen is easily removable, which allows the cooling duct to be easily tailored for use with processor cards having various numbers of processor modules attached thereto.

In yet another aspect of the invention, the first flow of cooling gas and the second flow of cooling gas are simultaneously generated using fans that are external to the processor book, and that are used for cooling other parts of the computer system. As such, the cooling system operates without the need for extra fans, thus increasing the reliability of the arrangement.

According to another aspect of the invention, although the cooling gas is typically ambient air, the cooling gas is not limited as such. Other cooling gasses may also be used, as will be appreciated by one skilled in the art.

According to yet a further aspect of the invention, a method of cooling an electronic component enclosure, for example, a processor book, is proposed. The method advantageously conveys a cooling gas to a circuit board, from two separate directions.

DETAILED DESCRIPTION OF THE PREFERRED EMBODIMENTS

The invention will now be described in more detail by way of example with reference to the embodiments shown in the accompanying figures. It should be kept in mind that the following described embodiments. are only presented by way of example and should not be construed as limiting the inventive concept to any particular physical configuration.

Figure 1:
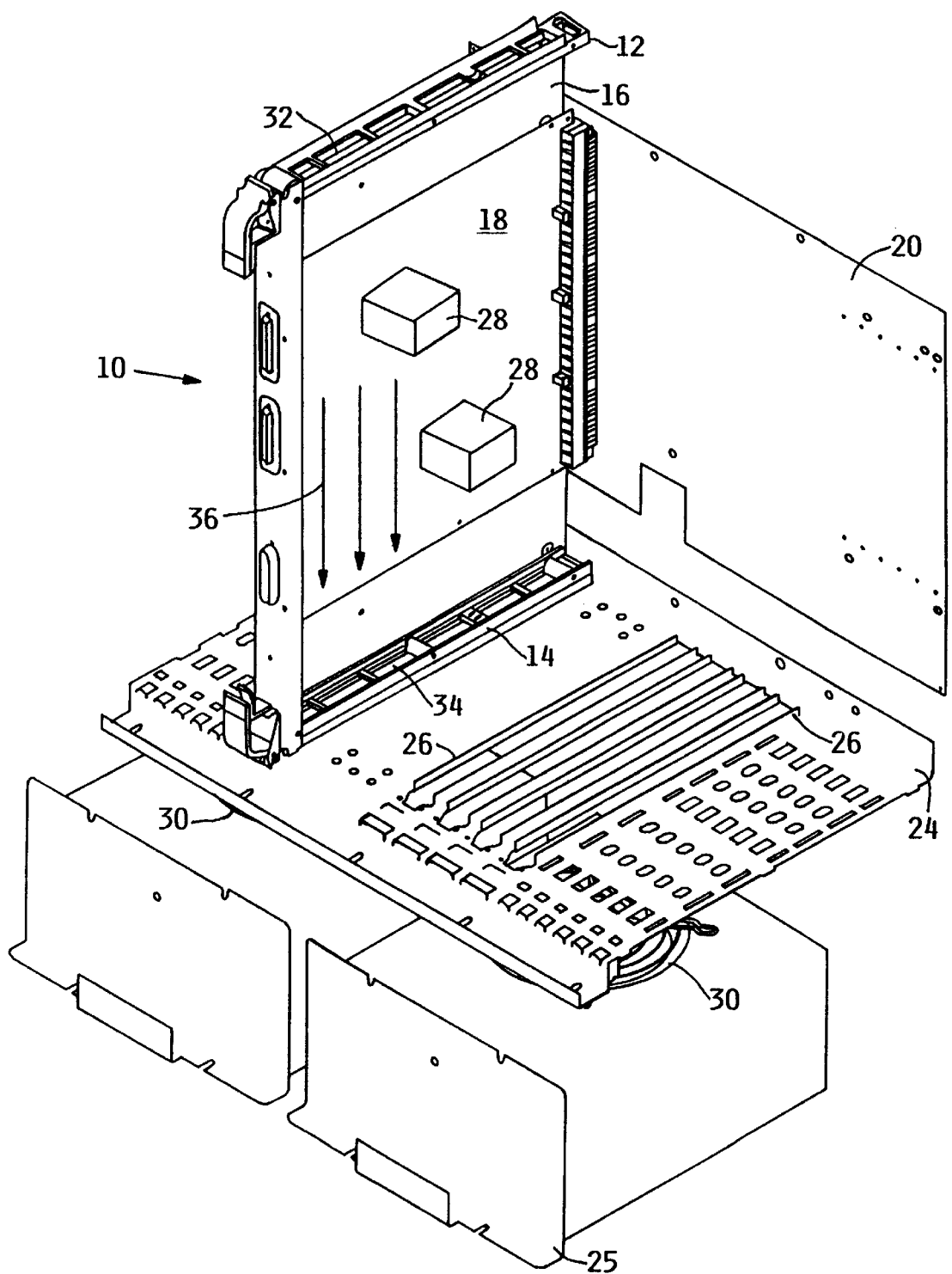
FIG. 1 is a perspective, partially exploded illustration of a known processor book using a conventional cooling arrangement in a computer housing.
Figure 2:
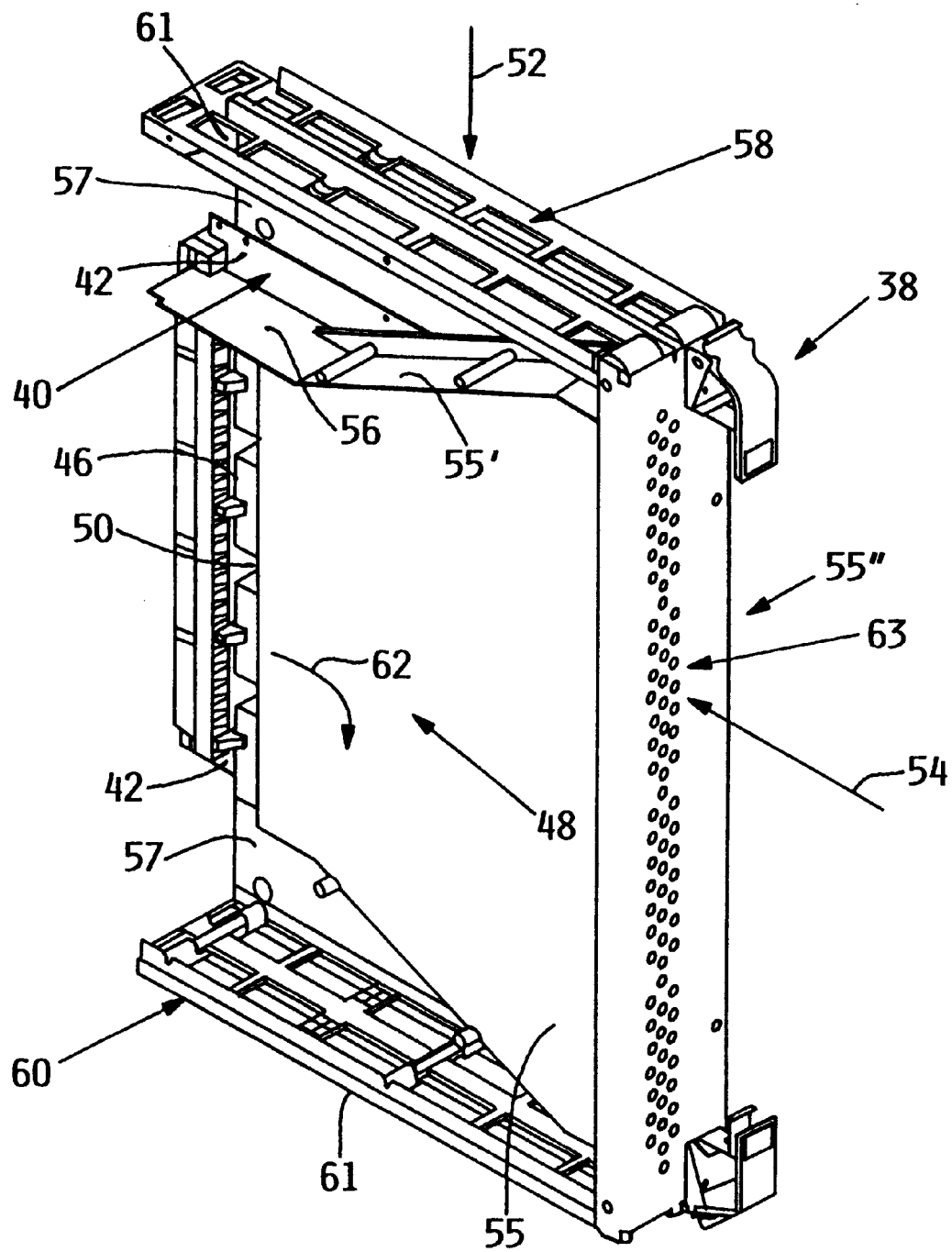
FIG. 2 is a front perspective view of a processor book with a front cover of the processor book removed, according to an exemplary embodiment of the invention.

FIG. 2 illustrates an exemplary electronic component enclosure, for example, a processor book 38 provided with a circuit board, for example, processor card 40. The processor card 40 can be, for example, a Symmetrical Multi Processor card, and have a front surface 42 and a rear surface (not shown). At least one high heat component 46, for example, a heat sink 46' covering a processor module 46" (shown in FIG. 3), is attached to the front surface 42. A cooling duct 48, comprised of plastic, for example, is provided adjacent to the front surface 42, and has an outlet 50 in a region of the high heat component 46. The cooling duct 48 is thus situated to deliver fresh cooling gas directly to the high heat component 46.

The cooling duct 48 is part of a cooling arrangement that delivers a cooling gas, such as ambient air, to the processor card 40 from two different directions, as indicated by the arrows 52, 54. This is advantageous when a plurality of high heat components 46, such as a plurality of processor modules and associated heat sinks, are sequentially arranged along a common edge of the processor card 40, such as is shown in this Figure, and as is common with Symmetrical Multi Processor computer systems.

In particular, the cooling duct 48 provides a flow of cooling gas to the high heat component 46 in direction 54, which is essentially perpendicular to the direction 52.

Figure 5:
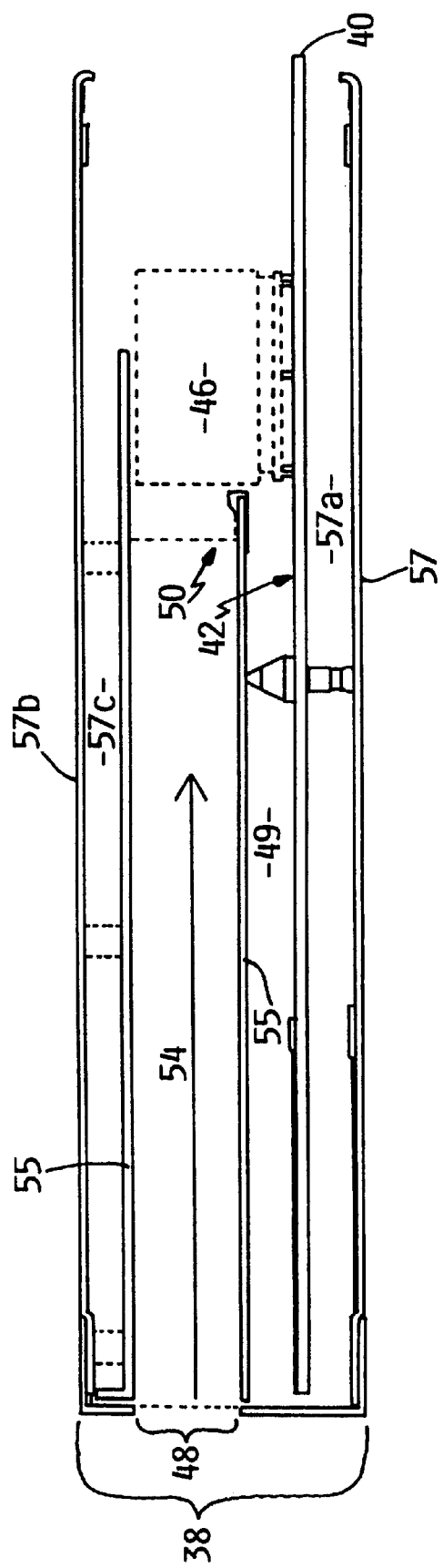
FIG. 5 is a sectional view taken along line V—V in FIG. 3.

Additionally, and as best shown in FIG. 5 the cooling duct 48 is separated from the front surface 42 of the processor card 40 by a space 49. This allows for additional cooling gas to flow in direction 52 between the cooling duct 48 and the processor card 40, and over the surface of the processor card.

Figure 3:
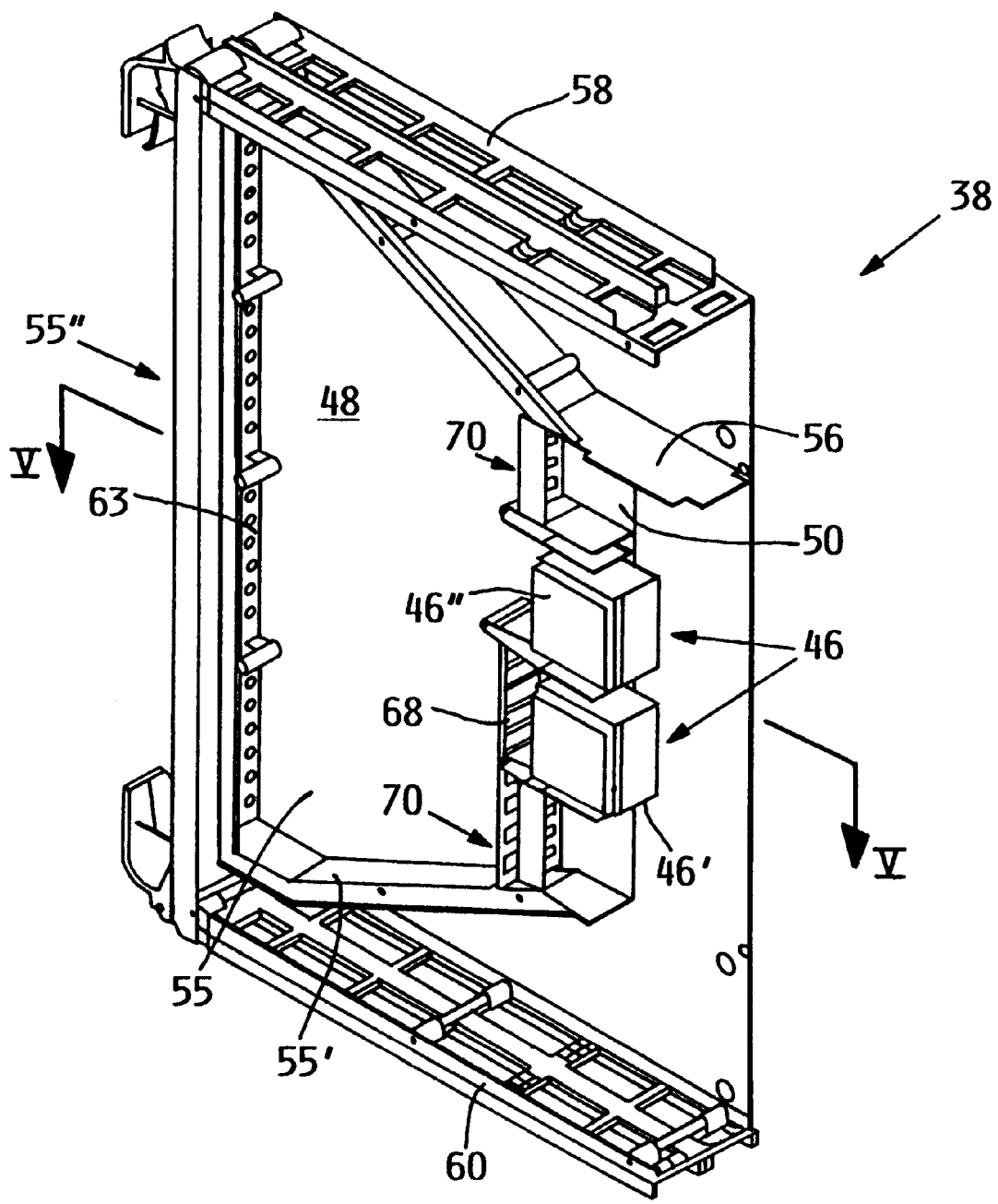
FIG. 3 is a rear perspective view of the exemplary processor book shown in FIG. 2, but with a rear cover, processor board, and a bottom of the duct removed to illustrate the baffle screens, and illustrating two heat sinks.

As shown best in FIG. 3, the cooling duct 48 can be formed of two parallel, spaced apart panels 55, and two upright sides 55'. The panels 55 may have a generally trapezoidal shape, so that the cooling duct 48 is tapered toward the high heat component 46. This provides for a large inlet 55", and forms a nozzle which increases the speed of cooling gas past the high heat component 46.

The cooling duct 48 further includes an extension 56 attached to the upper, upright side 56'. Extension 56 extends over the high heat components 46, and acts as a flow barrier so as to help prevent the additional cooling gas flowing over the processor card from reaching the high heat components. As such, the high heat components 46 are primarily cooled using the flow of cooling gas exiting from the cooling duct 48.

Further, and as shown in FIGS. 2 and 5, the processor book 38 typically includes front and rear opposing covers having the processor card 40 and the cooling duct 48 therebetween. For clarity of illustration reasons, the front cover has been removed in this Figure. The rear cover 57 is adjacent to and separated from the rear surface of the processor card 40 by a space 57a. This allows for the flow of the cooling gas over the rear surfaces of the processor card in the direction 52. The front cover is likewise adjacent to and separated from the cooling duct 48 by a further space. This allows for the flow of cooling gas exiting the duct 48 to be turned downward, and flow out of the book, as will be further described in the paragraphs that follow.

The processor book 38 further includes upper and lower opposing rails 58, 60 connected to the front and rear covers. The rails are arranged to extend generally in second direction 54. The rails 58, 60 have a plurality of respective openings 61 therethrough to allow the cooling gas to flow through the upper rail 58, over the surfaces of processor card 40 (as previously described), and out through the lower rail 60 in direction 52. Moreover, the cooling gas additionally flows in direction 54 from the outlet 50 of the cooling duct and to the high heat component 46. Once in a region of the high heat component 46, the flow of cooling gas exiting from cooling duct 48 is drawn downward and out through the lower rail 60, as indicated by the curved arrow 62. As a result of this arrangement, the cooling gas is provided to the processor card 40 from two different directions, so that heat generated thereby is effectively transferred to the cooling gas, and transported away.

Referring back to FIG. 3, preferably a perforated cover 63 is provided which extends from the upper rail 58 to the lower rail 60, and is arranged to cover inlet 55" of the cooling duct. Preferably, the cooling duct 48 is fixed to the perforated cover 63, and the perforated cover 63 is fixed to the upper and lower rails 58, 60. Thus, the perforated cover, rails and cooling duct are all fixed together, which helps support the cooling duct in its desired position, and provides structural stability to the processor book 38.

FIG. 3 shows the processor book 38 with the rear cover, processor board, and the bottom panel of duct 48 removed, in order to better illustrate the cooling gas baffle screens 68, which are provided in the outlet 50 of the cooling duct. The baffle screens regulate and equalize the gas flow over the high heat components 46 when a plurality of high heat components 46 are present, and ensure that the upper high heat components (i.e., those closest to the upper rail 58) are provided with sufficient cooling gas. Without the baffle screens, the gas flow would tend to follow the path of least resistance, and would pass in greater quantities by the lower components 46. Moreover, the baffle screens 68 allow the cooling duct 48 to be easily modified for use with processor cards having various numbers of high heat components attached thereto. For example, in FIG. 3, two heat sinks are provided along the edge of the processor card. However, this illustrated duct is adapted to accommodate up to four heat sinks. Without the baffle screens, the cooling gas would tend to pass through the openings 70 where the missing heat sinks would be located, thus not adequately cooling the remaining heat sinks. As such, baffle screens 68 are placed in these openings to imitate the flow resistance that the missing heat sinks would have provided. Moreover, preferably the baffle screens 68 are easily inserted and removed in position, in any known manner as would be apparent to one skilled in the art.

Figure 4:
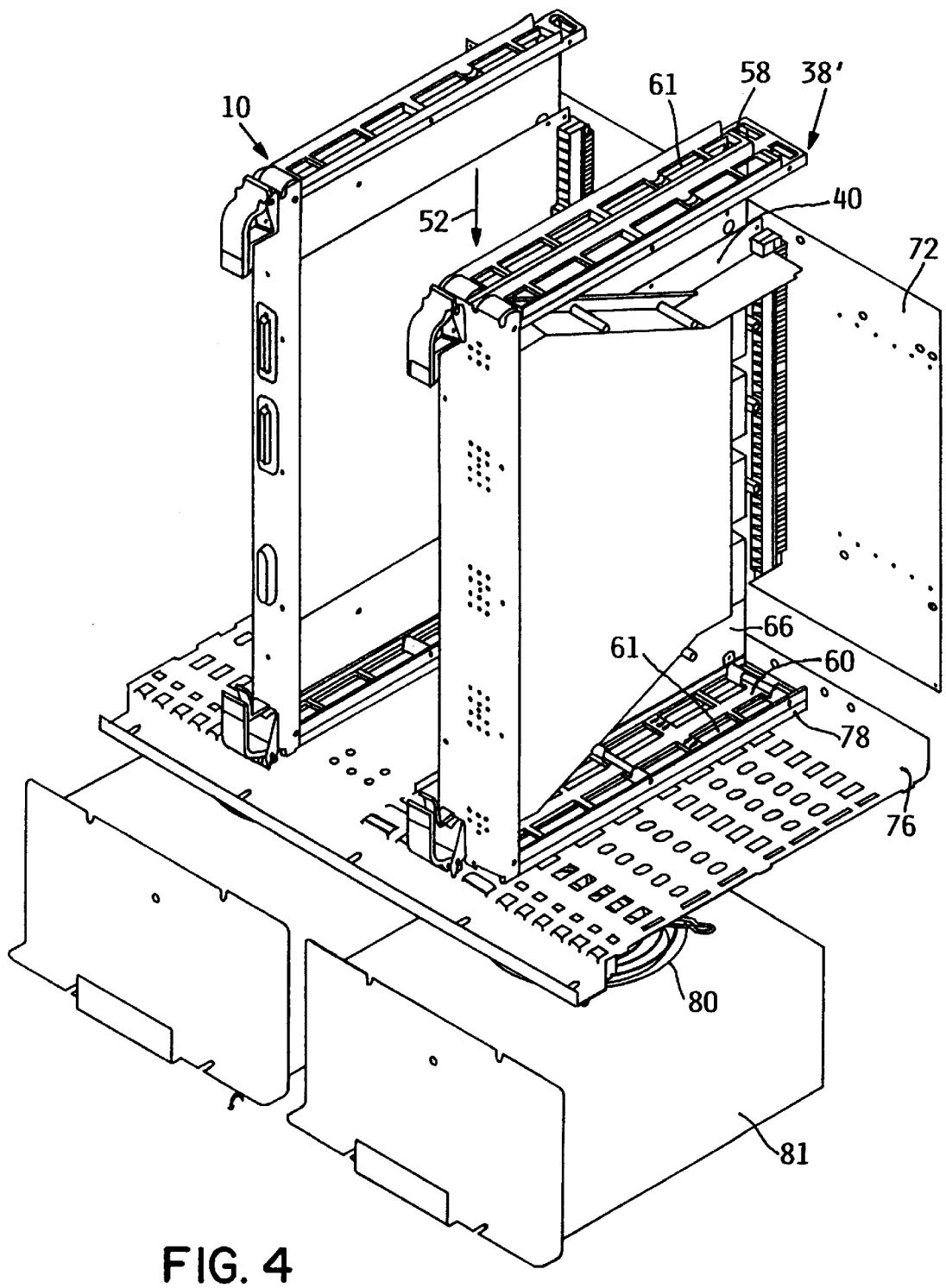
FIG. 4 is a partially exploded, front perspective illustration of an alternative exemplary embodiment of the processor book according to the present invention attached to a back plane.

Referring to FIG. 4, the processor book is open along one edge, so that the processor card 40 can be connected to a backplane 72. In this Figure, for illustration purposes, the rear cover of the processor book has been removed. Moreover, this Figure illustrates an alternative configuration of the processor book, in which the processor card 40 is arranged between cooling duct 48 and the front cover 66 of the processor book. As such, this processor book 38', known as a right-hand processor book, differs from the processor book 38 shown in FIG. 2, known as a left-hand processor book, only in that the front cover 66 is adjacent to and separated from the processor card by a space, and the rear cover (not shown) is adjacent to and separated from the cooling duct 48 by a further space. However, this book 38' is similar in operation to the processor book 38 shown in FIG. 2, and likewise allows for a first flow of cooling gas to be provided to the front and rear surfaces of the processor card in direction 52, as well as a second flow of cooling gas through duct 48, as was previously described.

The processor book is arranged within a computer housing 74 so as to be perpendicular to the backplane 72. Typically, the processor book is located between upper and lower cage shelves located within a computer housing (not shown). For clarity reasons, only the lower cage shelf 76 is shown. The lower cage shelf 76 includes guides 78 which engage with lower rail 60, and ensure that the processor book is properly located. Likewise, the upper cage shelf is provided with similar guides for engaging with the upper rail 58.

The flows of cooling gas may be simultaneously generated using a fan 80 that is external to the processor book and located within housing 81. The fan 80 is attached beneath cage shelf 76, so as to be located beneath the lower rails 60 of the respective processor books.

During operation, the fan 80 causes a reduced pressure zone in the area beneath the processor books, so that the cooling gas is drawn through openings 61 provided in the upper rail 58, over a surface of the processor card 40, and out through openings 61 provided in the lower rail 60. As will be appreciated, this flow of cooling gas is essentially parallel to a surface of the backplane 72 which the processor card is attached to, as indicated by arrow 52. Additionally, fresh cooling gas will be drawn through the cooling duct 48 to directly cool the high heat component or components, after which the heated gas is likewise drawn through the openings 61 provided in the lower rail 60. As will be appreciated, this cooling arrangement renders extra cooling fans unnecessary, thus increasing the reliability of the arrangement.

Additionally, as shown in FIG. 4, the processor book according to the present invention can be used side-by-side with conventional processor books 10, without having to make modifications to the computer housing the processor books are used in.

Although the cooling gas is typically ambient air, the cooling gas is not limited as such. Other cooling gasses may also be used, as will be appreciated by one skilled in the art.

It should be understood, however, that the invention is not necessarily limited to the specific arrangement and components shown and described above, but may be susceptible to numerous variations within the scope of the invention.

It will be apparent to one skilled in the art that the manner of making and using the claimed invention has been adequately disclosed in the above-written description of the preferred embodiments taken together with the drawings.

It will be understood that the above description of the preferred embodiments of the present invention are susceptible to various modifications, changes, and adaptations, and the same are intended to be comprehended within the meaning and range of equivalents of the appended claims.

What is claimed is:

1. A cooling arrangement comprising:

an electronic component enclosure;

a circuit board disposed within said enclosure;

a cooling gas duct provided adjacent to a surface of the circuit board and being within said enclosure, and having a gas outlet in a region of at least one high heat component disposed at the surface of the circuit board, said cooling gas duct being separated from the surface of the circuit board by a space so as to allow a cooling gas to flow over the surface of the circuit card, and wherein said cooling gas duct provides a further flow of cooling gas directly to the high heat component, wherein said cooling gas duct comprises two parallel spaced-apart panels, and two sides, said sides and said panels being attached together to form a conduit for the further flow of cooling gas, with one of said two panels being separated from the surface of the circuit board by the space, with the cooling gas flowing over the surface of the circuit board additionally flowing between said one panel and the surface of the circuit board so as to cool the surface of the circuit board, whereby the further flow of cooling gas, and the cooling gas flowing between said one panel and the surface of said circuit board are physically separated from each other by only said one panel of said cooling gas duct.

2. A bi-directional cooling arrangement, comprising:

a circuit board having at least one high heat component disposed thereon;

means for conveying cooling gas to said circuit board from two separate directions, said means for conveying including a cooling gas duct that forms a conduit for a first flow of the cooling gas, the first flow of the cooling gas passing through said cooling gas duct in one of the two separate directions, and from an exit of said cooling gas duct directly to said high heat component to cool said high heat component, said cooling gas duct being separated from a surface of the circuit board by a space to allow a second flow of the cooling gas, for cooling the surface of the circuit board, to flow between said cooling gas duct and the surface of the circuit board in the other of the two separate directions; and an electronic component enclosure, including upper and lower opposing rails; and front and rear covers connected to said upper and lower opposing rails, said front and rear covers and said upper and lower rails collectively forming a hollow parallelepiped with said cooling gas duct and said circuit board being disposed therein.

3. The cooling arrangement of claim 2, further comprising a perforated cover connected to and extending between said upper and lower rails, wherein said upper and lower rails having openings therein, the second flow of cooling gas passing through the openings in said upper rail, between said cooling gas duct and the surface of said circuit board, and through the openings in said lower rail, said cooling gas duct being fixed to said perforated cover in a region of an inlet opening of said cooling gas duct, the first flow of cooling gas passing through said perforated cover, through said cooling gas duct, and out through the openings in one of said upper and lower rails, whereby the first flow of the cooling gas, and the second flow of the cooling gas are physically separated from each other in a region of the cooling gas duct by only said cooling gas duct.

4. A cooling arrangement, comprising:

an enclosure having a plurality of sides interconnected together to define an interior space of said enclosure, with at least one of said sides having at least one opening therein;

a circuit board positioned in the interior space of said enclosure, and having at least one high heat component disposed thereon; and a cooling gas duct disposed in the interior space of said enclosure and being positioned adjacent to a surface of the circuit board, said cooling gas duct being connected to said at least one side so that an inlet opening of said cooling gas duct is positioned in registration with, adjacent to and in communication with the opening in the side of said enclosure, said cooling gas duct having a gas outlet in a region of the at least one high heat component, said cooling gas duct providing a flow of cooling gas that directly enters the inlet opening through the opening in the side of said enclosure, and that exits the gas outlet to impinge upon the high heat component, said cooling gas duct further having:

a first side that extends from the inlet opening to the gas outlet, and that at least partially forms an outer periphery of the gas outlet; and an extension attached to said first side of said cooling gas duct and that projects out over and beyond the gas outlet, and over the at least one high heat component, with the extension forming a barrier to prevent a further flow of cooling gas from reaching the high heat component so that the high heat component is primarily cooled using the flow of cooling gas provided by said cooling gas duct.

5. The cooling arrangement of claim 4, wherein said cooling gas duct comprises two spaced-apart panels, and a second side spaced-apart from said first side, said sides and said panels being attached together to form a conduit having the gas inlet and the gas outlet at opposing ends thereof.

6. The cooling arrangement of claim 5, wherein said conduit is tapered from the gas inlet toward the gas outlet.

7. The cooling arrangement of claim 4, wherein said cooling gas duct has at least one baffle screen removably positioned in the gas outlet, and being sized smaller than a size of the gas outlet so as to only cover a portion of the gas outlet.

8. A bi-directional cooling arrangement, comprising:

an electronic component enclosure having a plurality of sides collectively defining an internal space within said enclosure, said plurality of sides including a first side and a second side opposing said first side, and a third side extending from said first side to said second side, each of said first side, said second side and said third side having an opening therein, the opening in the first side and the opening in the second side defining a first flow path for a cooling gas that passes through the opening in the first side, through the internal space in said enclosure, and out through the opening in the second side; and a cooling gas duct provided within said enclosure, said cooling gas duct having a gas inlet positioned adjacent to said third side and being in communication with the opening therein, and having a gas outlet positioned in the internal space in said enclosure, said cooling gas duct defining a second flow path for the cooling gas that passes from outside of said enclosure via the opening in said third side, through said cooling gas duct, and out through the gas outlet.

9. The bi-directional cooling arrangement of claim 8, further comprising a circuit board positioned within said enclosure and adjacent to said cooling gas duct, said circuit board having at least one high heat component disposed thereon, the first flow path for a cooling gas additionally passing directly over the circuit board to cool the circuit board; and the gas outlet of said cooling gas duct being disposed in a region of the at least one high heat component so that the second flow path for the cooling gas passes through the cooling gas duct and directly to the high heat component.

10. The bi-directional cooling arrangement of claim 8, wherein said plurality of sides further includes a fourth side, and a fifth side opposing said fourth side, both said fourth side and said fifth side being connected to said first side, said second side and said third side to form a hollow parallelepiped.

11. The bi-directional cooling arrangement of claim 10, wherein said first side and said second side are upper and lower opposing rails, and said fourth side and said fifth side are front and rear opposing covers.

* * * * *